(12) United States Patent
Sano

(10) Patent No.: US 11,469,105 B2
(45) Date of Patent: Oct. 11, 2022

(54) HEAT TREATMENT DEVICE AND TREATMENT METHOD

(71) Applicant: Tokyo Electron Limited, Tokyo (JP)

(72) Inventor: Yohei Sano, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 97 days.

(21) Appl. No.: 16/934,097

(22) Filed: Jul. 21, 2020

(65) Prior Publication Data

US 2021/0028008 A1    Jan. 28, 2021

(30) Foreign Application Priority Data

Jul. 22, 2019  (JP) .............................. JP2019-134446
Dec. 12, 2019  (JP) .............................. JP2019-224598

(51) Int. Cl.
| | |
|---|---|
| *H01L 21/027* | (2006.01) |
| *H01L 21/02* | (2006.01) |
| *H01L 21/324* | (2006.01) |
| *G03F 7/20* | (2006.01) |
| *G03F 7/09* | (2006.01) |
| *H05B 3/26* | (2006.01) |

(52) U.S. Cl.
CPC ............ *H01L 21/0274* (2013.01); *G03F 7/09* (2013.01); *G03F 7/20* (2013.01); *H01L 21/02104* (2013.01); *H01L 21/324* (2013.01); *H05B 3/262* (2013.01); *H05B 2203/022* (2013.01)

(58) Field of Classification Search
CPC ........... H01L 21/0274; H01L 21/02104; H01L 21/324; H01L 21/67109; H01L 21/6715; H01L 21/67178; H01L 21/67253; H01L 21/68735; H01L 21/68742; H01L 21/67103; H01L 21/67098; G03F 7/09; G03F 7/20; G03F 7/38; H05B 3/262; H05B 2203/022
USPC ............................. 430/269; 34/59, 443, 487
See application file for complete search history.

(56) References Cited

U.S. PATENT DOCUMENTS

| | | | | |
|---|---|---|---|---|
| 2007/0169373 | A1* | 7/2007 | Aoki ................. | H01L 21/67748 34/443 |
| 2012/0088369 | A1* | 4/2012 | Weidman ............ | H01L 21/0217 430/296 |
| 2016/0172218 | A1* | 6/2016 | Mizuta ................. | F27D 3/0084 438/795 |
| 2020/0020554 | A1* | 1/2020 | Lee .................... | H01L 21/67178 |

FOREIGN PATENT DOCUMENTS

JP       2016-530565 A       9/2016

* cited by examiner

*Primary Examiner* — Caleen O Sullivan
(74) *Attorney, Agent, or Firm* — Venjuris, P.C.

(57) ABSTRACT

A heat treatment device includes: a heating plate that supports and heats a substrate on which a resist film is formed, and the resist film is subjected to an exposure process; a chamber that covers a processing space above the heating plate; a gas ejecting unit that ejects a processing gas from above toward the substrate on the heating plate within the chamber; a gas supply unit that supplies a gas into the chamber from below a surface of the substrate, within the chamber; and an exhaust unit that evacuates inside of the chamber through exhaust holes that are formed above the processing space and open downwards.

12 Claims, 9 Drawing Sheets

HEAT TREATMENT DEVICE AND TREATMENT METHOD

CROSS-REFERENCE TO RELATED APPLICATIONS

This application is based on and claims priority from Japanese Patent Application Nos. 2019-134446 and 2019-224598 filed on Jul. 22, 2019 and Dec. 12, 2019, respectively, with the Japan Patent Office, the disclosures of which are incorporated herein in their entireties by reference.

TECHNICAL FIELD

The present disclosure relates to a heat treatment device and a heat treatment method.

BACKGROUND

In order to implement a finer resist pattern, a heat treatment on a substrate using a metal-containing resist as a resist that contains metal has been suggested (see e.g., Japanese Patent Laid-Open Publication No. 2016-530565).

SUMMARY

According to one aspect of the present disclosure, a heat treatment device is a heat treatment device that performs heat treatment on a substrate on which a film of a resist is formed, after an exposure processing is performed on the film. The heat treatment device includes: a heating plate that supports and heats the substrate; a chamber that covers a processing space above the heating plate; a gas ejecting unit that ejects a processing gas from above toward the substrate on the heating plate within the chamber; a gas supply unit that supplies a gas into the chamber from below a surface of the substrate, in the chamber; and an exhaust unit that evacuates inside of the chamber through exhaust holes that are formed above the processing space and open downwards.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
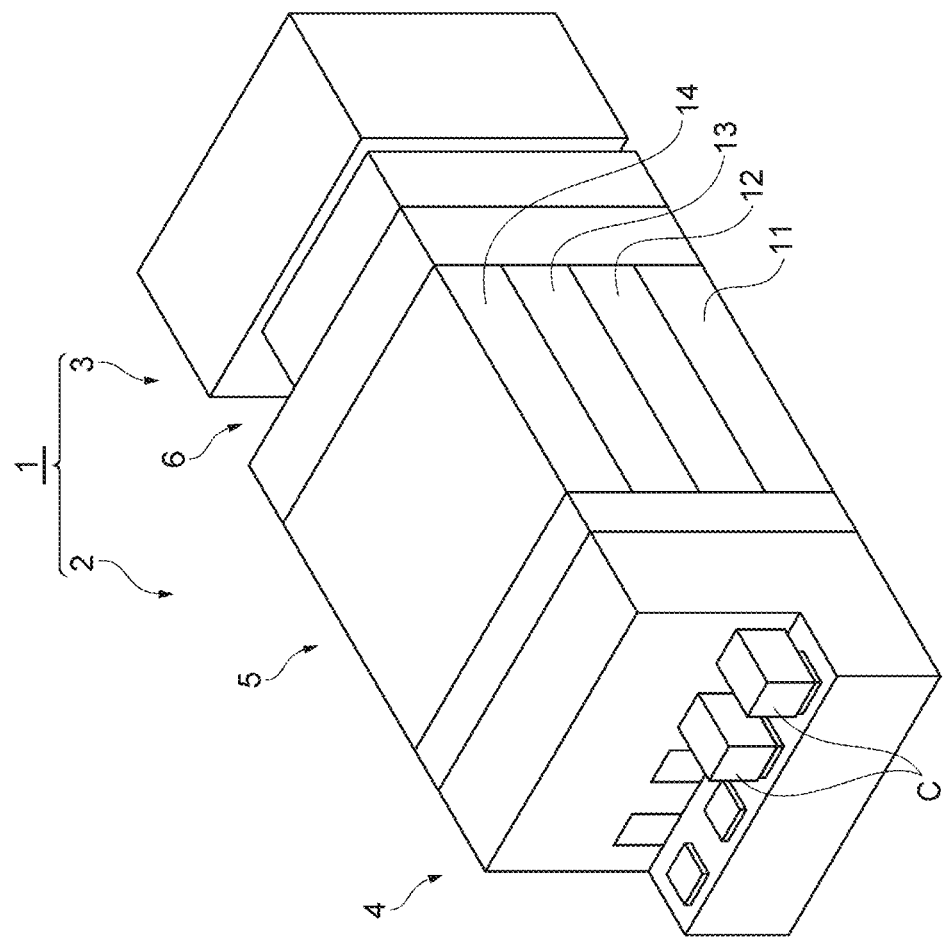
FIG. 1 is a view illustrating a schematic configuration of a substrate processing system according to one embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, various embodiments will be described.

A heat treatment device according to one embodiment is a heat treatment device that performs heat treatment on a substrate on which a film of a resist is formed, after an exposure processing is performed on the film. The heat treatment device includes: a heating plate that supports and heats the substrate; a chamber that covers a processing space above the heating plate; a gas ejecting unit that ejects a processing gas from above toward the substrate on the heating plate within the chamber; a gas supply unit that supplies a gas into the chamber from below a surface of the substrate, in the chamber; and an exhaust unit that evacuates inside of the chamber through exhaust holes that are formed above the processing space and open downwards.

According to the above-described heat treatment device, a processing gas is ejected from the gas ejecting unit toward the surface of the substrate so that the heat treatment of the substrate is facilitated. Meanwhile, the heat treatment device includes the gas supply unit that supplies a gas into the chamber from below the surface of the substrate, and the exhaust unit that evacuates inside of the chamber from the exhaust hole that is formed above the processing space and is open downwards. Thus, a gas flowing between these forms an upward flow around the substrate. Thus, the movement of a sublimate generated from the substrate during the heat treatment is blocked by the upward flow. Therefore, it is possible to suppress scattering of the sublimate from the film on the substrate.

In the aspect, the film may be a film including a metal-containing resist.

When a metal-containing resist is used, since a sublimate from a film contains a metal component, influence by adhesion to each unit within the device may be large. Meanwhile, by employing the above-described configuration, it is possible to suppress the scattering of the sublimate that contains the metal component from the film on the substrate. Therefore, it is possible to effectively reduce the influence by adhesion of the sublimate to the device.

In the aspect, the exhaust hole may be formed inside a periphery edge of the gas ejecting unit.

When the exhaust hole is formed inside the periphery edge of the gas ejecting unit, the gas toward the exhaust hole, that is, the gas including the sublimate from the film on the substrate, forms an upward flow toward the inside of the periphery edge of the gas ejecting unit. Thus, it is possible to suppress the sublimate from scattering from the film on the substrate to the outside of the substrate.

In the aspect, at least a part of the exhaust hole may be formed at a periphery outside the substrate.

When at least a part of the exhaust hole is formed at the periphery outside the substrate, since a flow of a gas toward the exhaust hole at the top side is formed around the substrate, the movement of the sublimate to the outside of the flow of the gas toward the exhaust hole is suppressed.

Therefore, it is possible to suppress the sublimate from scattering from the film on the substrate to the outside of the substrate.

In the aspect, the gas supply unit may supply the gas into the chamber from a periphery outside the substrate.

A gas is supplied from the periphery outside the substrate into the chamber, and thus it is possible to form an upward flow in which the air flow is further strengthened, around the substrate.

In the aspect, the gas supply unit may include: a gas flow path connected to the inside of the chamber; and a rectifying unit that controls a flow path area at an end portion of the gas flow path on the chamber side.

Since the rectifying unit is provided, it is possible to control a flow path area at the end portion of the gas flow path on the chamber side. By employing a configuration where the flow path area is controlled, for example, it is also possible to control an upward flow such that it is possible to further suppress the scattering of a sublimate. It is also possible to control the upward flow in consideration of the quality of a resist pattern on the substrate.

In the aspect, an outer space may be provided within the chamber, above the rectifying unit outside the exhaust unit in a radial direction of the substrate; a second gas supply unit different from the gas supply unit may be provided, which is connected to the outer space and supplies a gas into the chamber; and the second gas supply unit may be connected to the outer space on the rectifying unit side.

As described above, when the outer space is formed outside the exhaust unit in the radial direction of the substrate, and a gas is also supplied from the second gas supply unit connected to the outer space, the gas that is supplied from the second gas supply unit and moves in the outer space also moves toward the exhaust hole. Thus, the disturbance of an upward flow may be prevented within the chamber, and the scattering of a sublimate may be suppressed. The second gas supply unit is configured to be connected to the outer space on the rectifying unit side. Thus, like the upward flow, the gas from the second gas supply unit may move toward the exhaust hole while moving upwards, and thus, the gas may be prevented from staying in the outer space and the vicinity thereof.

In the aspect, the gas supply unit may include a gas flow path connected to the inside of the chamber, and the gas flow path may be capable of transferring heat from the heating plate.

Through the above-described configuration, a gas that moves through the gas flow path is supplied into the chamber in a state where the gas is heated by the heat from the heating plate. Therefore, it is possible to suppress, for example, temperature fluctuation due to supplying of the gas.

In the aspect, the gas ejecting unit may include a plurality of ejecting holes scattered along a surface facing the substrate on the heating plate.

Through the above-described configuration, since a processing gas may be more uniformly ejected toward the surface of the substrate from the gas ejecting unit, the quality of a resist pattern may be enhanced.

A heat treatment method according to another embodiment is a heat treatment method in which heat treatment is performed on a substrate on which a film of a resist is formed by supporting and heating on a heating plate after an exposure processing is performed on the film. The method includes supplying a gas into a chamber from below a surface of the substrate, within the chamber, and evacuating inside of the chamber from an exhaust hole that is formed above a processing space within the chamber and is open downwards, so that the heat treatment is performed while an upward flow is formed around the substrate.

According to the above-described heat treatment method, a gas is supplied into the chamber from below the surface of the substrate, and the inside of the chamber is evacuated from the exhaust hole that is formed above the processing space and is open downwards so that the heat treatment is performed while the upward flow is formed around the substrate. Thus, the movement of a sublimate generated from the substrate during the heat treatment is blocked by the upward flow. Therefore, it is possible to suppress scattering of the sublimate from the film on the substrate.

Hereinafter, various embodiments will be described in detail with reference to drawings. Meanwhile, in the drawings, the same or corresponding parts will be denoted by the same reference numerals.

First Embodiment

[Substrate Processing System]

A substrate processing system according to a first embodiment will be described with reference to FIGS. 1 to 6. A substrate processing system 1 is a system that forms a photosensitive film on a substrate, exposes the photosensitive film, and develops the photosensitive film. A substrate to be processed is, for example, a semiconductor wafer W. The photosensitive film is, for example, a resist film. The substrate processing system 1 includes a coating/developing apparatus 2 and an exposure apparatus 3. The exposure apparatus 3 is an apparatus that exposes a resist film (photosensitive film) formed on the wafer W (substrate). Specifically, the exposure apparatus 3 irradiates an exposure target portion of the resist film with energy rays by a method such as immersion exposure. The coating/developing apparatus 2 performs a processing of coating a resist (chemical solution) on the surface of the wafer W (substrate) and forming a resist film before the exposure processing by the exposure apparatus 3, and performs a development processing of the resist film after the exposure processing. In the following embodiments, descriptions will be made on a case where the substrate processing system 1 forms a metal-containing resist film by using a resist that contains a metal (hereinafter, referred to as a "metal-containing resist"). For example, the substrate processing system 1 may form the film by using a tin (Sn)-containing resist. Meanwhile, the type of the resist is not limited to the above.

[Substrate Processing Apparatus]

Figure 2:
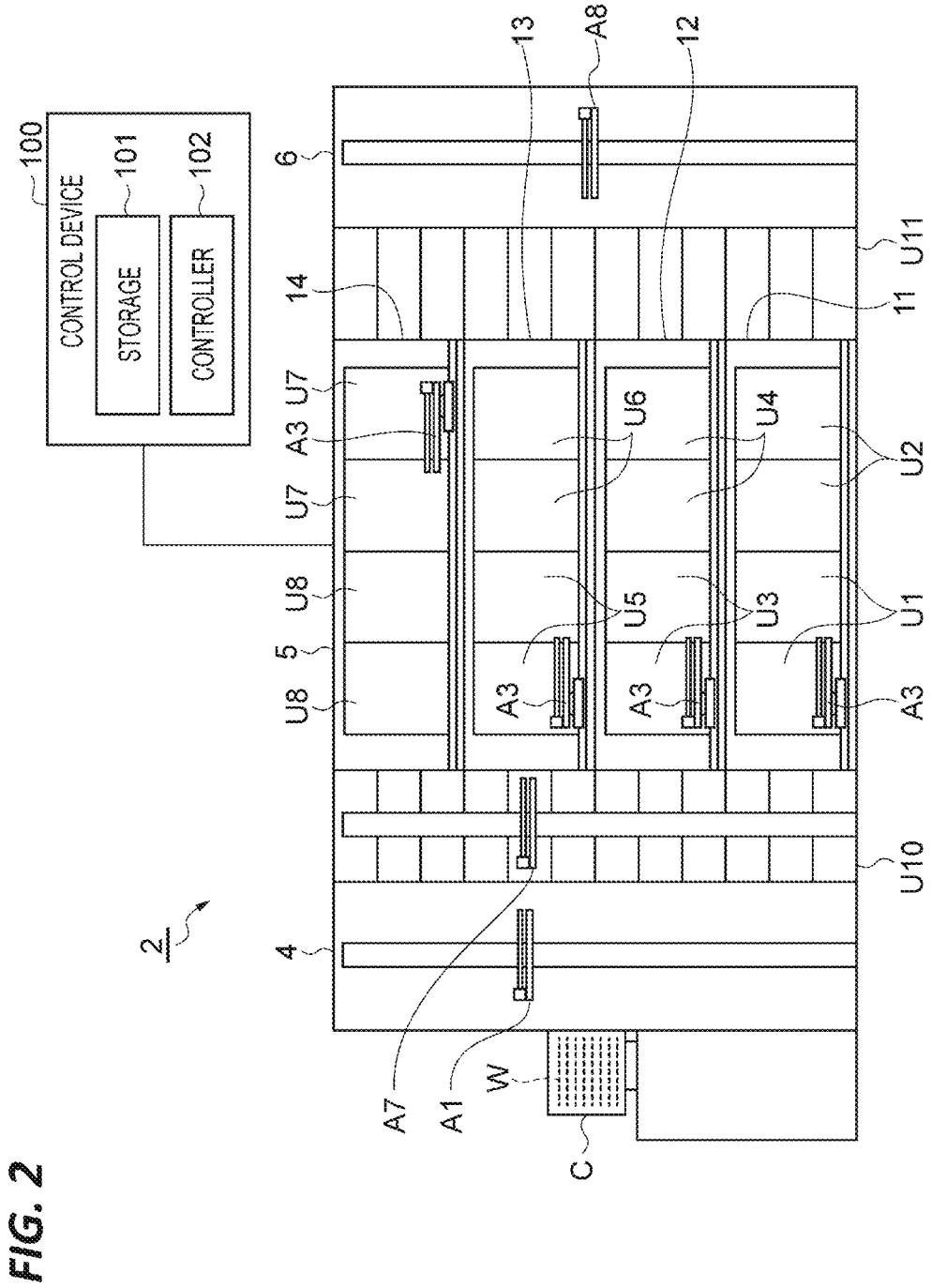
FIG. 2 is a schematic view illustrating the internal configuration of a substrate processing apparatus.

Hereinafter, descriptions will be made on the configuration of the coating/developing apparatus 2 as an example of a substrate processing apparatus. As illustrated in FIG. 1 and FIG. 2, the coating/developing apparatus 2 includes a carrier block 4, a processing block 5, an interface block 6, and a control device 100.

The carrier block 4 carries wafers W into the coating/developing apparatus 2 and carries the wafers W out of the coating/developing apparatus 2. For example, the carrier block 4 is able to support a plurality of carriers C for the wafers W. Within the carrier block 4, a transfer device A1 including a delivery arm is included. The carrier C accommodates, for example, a plurality of circular wafers W. The transfer device A1 takes the wafers W out of the carrier C and delivers the wafers W to the processing block 5, and receives the wafers W from the processing block 5 and returns the wafers W into the carrier C. The processing block 5 includes a plurality of processing modules 11, 12, 13, and 14.

Within the processing module 11, a coating unit U1, a heat treatment unit U2, and a transfer device A3 that transfers wafers W to these units are included. The processing module 11 forms an underlayer film on the surface of the wafer W by the coating unit U1 and the heat treatment unit U2. The coating unit U1 coats a processing liquid for forming the underlayer film, on the wafer W. The heat treatment unit U2 performs various heat treatments involved in formation of the underlayer film.

The processing module 12 performs a deposition processing of forming a film of a metal-containing resist. Within the processing module 12, a coating unit U3, a heat treatment unit U4, and a transfer device A3 that transfers wafers W to these units are included. The processing module 12 forms the film of the metal-containing resist on the underlayer film by the coating unit U3 and the heat treatment unit U4. The coating unit U3 coats the metal-containing resist as a processing liquid for film formation, on the underlayer film. The heat treatment unit U4 performs various heat treatments involved in formation of the film. Accordingly, the film of the metal-containing resist is formed on the surface of the wafer W.

Within the processing module 13, a coating unit U5, a heat treatment unit U6, and a transfer device A3 that transfers wafers W to these units are included. The processing module 13 forms an upper-layer film on the resist film by the coating unit U5 and the heat treatment unit U6. The coating unit U5 coats a liquid for forming the upper-layer film, on the resist film. The heat treatment unit U6 performs various heat treatments involved in formation of the upper-layer film.

Within the processing module 14, a developing unit U7 (development processing unit), a heat treatment unit U8, and a transfer device A3 that transfers wafers W to these units are included. The processing module 14 performs a development processing on the film on which an exposure processing has been performed, and a heat treatment involved in the development processing, by the developing unit U7 and the heat treatment unit U8. Accordingly, a resist pattern using the metal-containing resist is formed on the surface of the wafer W. Specifically, the heat treatment unit U8 performs a heat treatment (PEB: post exposure bake) before the development processing. The developing unit U7 performs the development processing on the wafer W on which the heat treatment (PEB) has been performed by the heat treatment unit U8. For example, the developing unit U7 performs the development processing on the film of the metal-containing resist by coating a developing solution on the surface of the wafer W which has been subjected to exposure, and washing the surface with a rinse solution. The heat treatment unit U8 may perform a heat treatment after the development processing (PB: post bake). Hereinafter, unless otherwise specified, the heat treatment in the heat treatment unit U8 will be described as "a heat treatment before a development processing (PEB)." The film of the metal-containing resist will be simply described as a "film."

A shelf unit U10 is provided on the carrier block 4 side in the processing block 5. The shelf unit U10 is divided into a plurality of cells arranged in the vertical direction. A transfer device A7 including a lifting arm is provided near the shelf unit U10. The transfer device A7 raises and lowers wafers W between cells of the shelf unit U10.

A shelf unit U11 is provided on the interface block 6 side in the processing block 5. The shelf unit U11 is divided into a plurality of cells arranged in the vertical direction.

The interface block 6 delivers wafers W to/from the exposure apparatus 3. For example, within the interface block 6, a transfer device A8 including a delivery arm is included. The interface block 6 is connected to the exposure apparatus 3. The transfer device A8 delivers the wafers W disposed on the shelf unit U11 to the exposure apparatus 3. The transfer device A8 receives the wafers W from the exposure apparatus 3 and returns the wafers W to the shelf unit U11.

Figure 3:
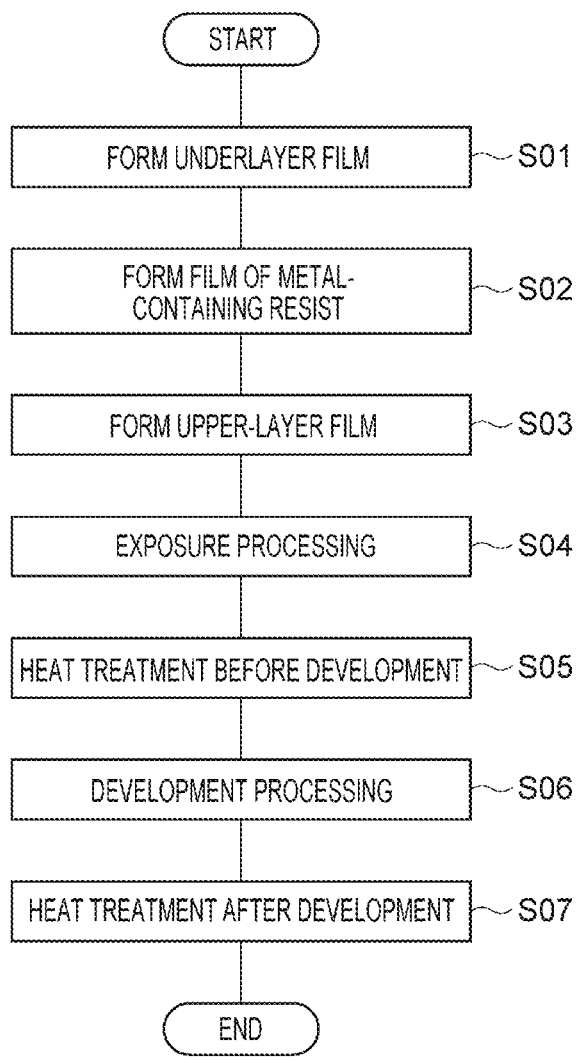
FIG. 3 is a flowchart illustrating an example of a substrate processing method.

FIG. 3 illustrates an example of a substrate processing procedure including a coating/development processing. The control device 100 controls the coating/developing apparatus 2 so as to execute a coating/development processing by, for example, the following procedure. First, the control device 100 controls the transfer device A1 so as to transfer a wafer W within the carrier C to the shelf unit U10, and controls the transfer device A7 so as to dispose the wafer W on a cell for the processing module 11.

Next, the control device 100 controls the transfer device A3 so as to transfer the wafer W in the shelf unit U10, to the coating unit U1 and the heat treatment unit U2 within the processing module 11. The control device 100 controls the coating unit U1 and the heat treatment unit U2 so as to form an underlayer film on the surface of the wafer W (step S01). Then, the control device 100 controls the transfer device A3 so as to return the wafer W on which the underlayer film is formed, to the shelf unit U10, and controls the transfer device A7 so as to dispose the wafer W on a cell for the processing module 12.

Next, the control device 100 controls the transfer device A3 so as to transfer the wafer W in the shelf unit U10, to the coating unit U3 and the heat treatment unit U4 within the processing module 12. The control device 100 controls the coating unit U3 and the heat treatment unit U4 so as to form a film of a metal-containing resist on the underlayer film of the wafer W (step S02). Then, the control device 100 controls the transfer device A3 so as to return the wafer W to the shelf unit U10, and controls the transfer device A7 so as to dispose the wafer W on a cell for the processing module 13.

Next, the control device 100 controls the transfer device A3 so as to transfer the wafer W in the shelf unit U10 to each unit within the processing module 13. The control device 100 controls the coating unit U5 and the heat treatment unit U6 so as to form an upper-layer film on the film of the wafer W (step S03). Then, the control device 100 controls the transfer device A3 so as to transfer the wafer W to the shelf unit U11.

Next, the control device 100 controls the transfer device A8 so as to send the wafer W accommodated in the shelf unit U11, to the exposure apparatus 3. Then, in the exposure apparatus 3, an exposure processing is performed on the film formed on the wafer W (step S04). Then, the control device 100 controls the transfer device A8 so as to receive the wafer W on which the exposure processing has been performed, from the exposure apparatus 3, and to dispose the wafer W, on a cell for the processing module 14 in the shelf unit U11.

Next, the control device 100 controls the transfer device A3 so as to transfer the wafer W in the shelf unit U11 to the heat treatment unit U8 within the processing module 14. Then, the control device 100 controls the heat treatment unit U8 so as to perform a heat treatment on the film of the wafer W prior to development (step S05). Next, the control device 100 controls the developing unit U7 and the heat treatment unit U8 so as to perform a development processing on the film of the wafer W on which the heat treatment has been performed by the heat treatment unit U8, and to perform a heat treatment after the development processing (step S06, S07). Then, the control device 100 controls the transfer device A3 so as to return the wafer W to the shelf unit U10, and controls the transfer device A7 and the transfer device A1 so as to return the wafer W into the carrier C. As described above, the substrate processing including the coating/development processing is completed.

Meanwhile, a specific configuration of the substrate processing apparatus is not limited to the configuration of the coating/developing apparatus 2 exemplified above. As for the substrate processing apparatus, any apparatus may be employed as long as it includes a unit that performs a deposition processing of forming a film of a metal-containing resist, a heat treatment unit that performs a heat treatment on the film after an exposure processing, a developing unit that performs a development processing on the film, and a control device capable of controlling these.

(Heat Treatment Unit)

Figure 4:
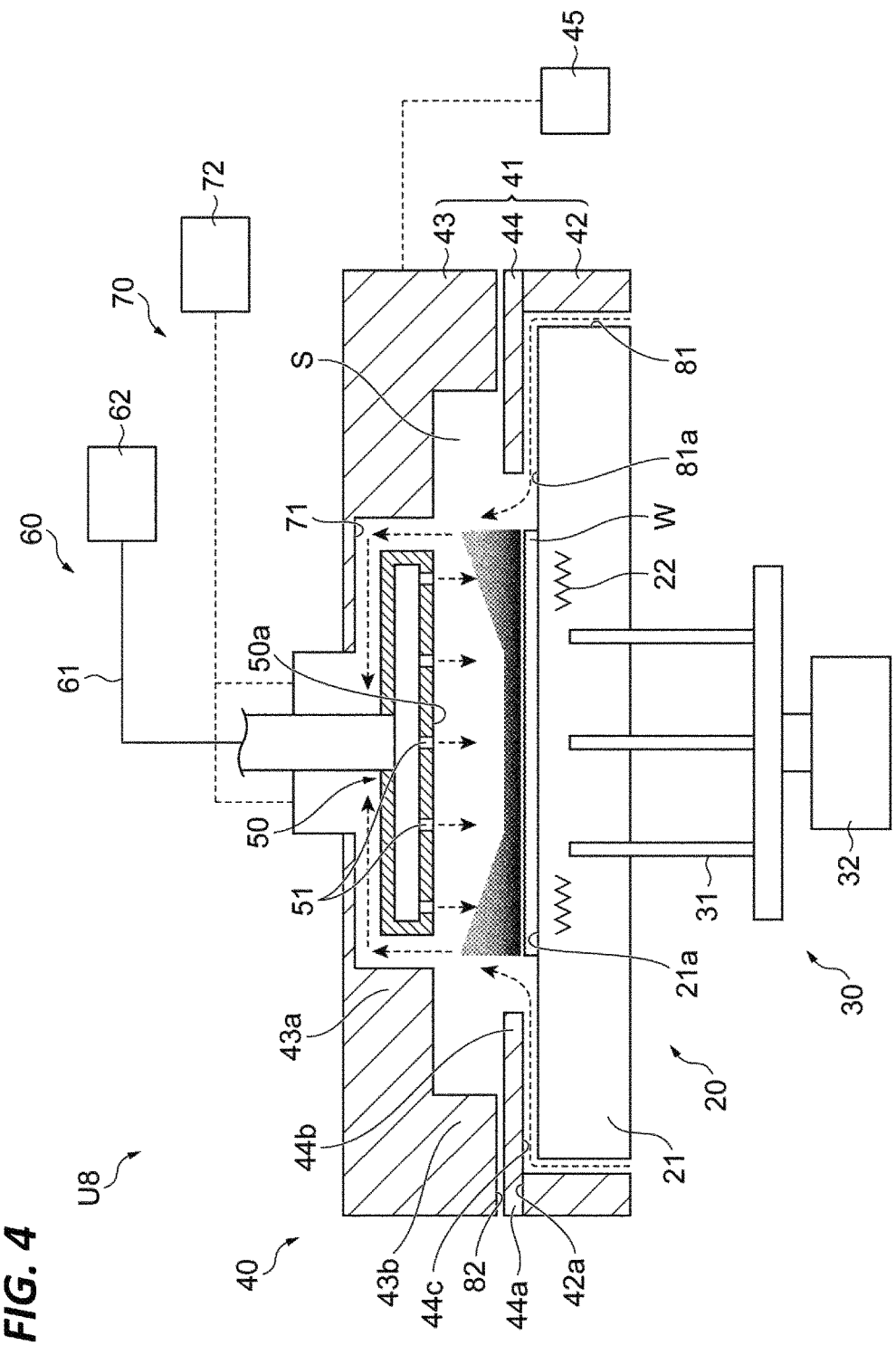
FIG. 4 is a schematic view illustrating the configuration of a heat treatment unit according to a first embodiment.
Figure 5:
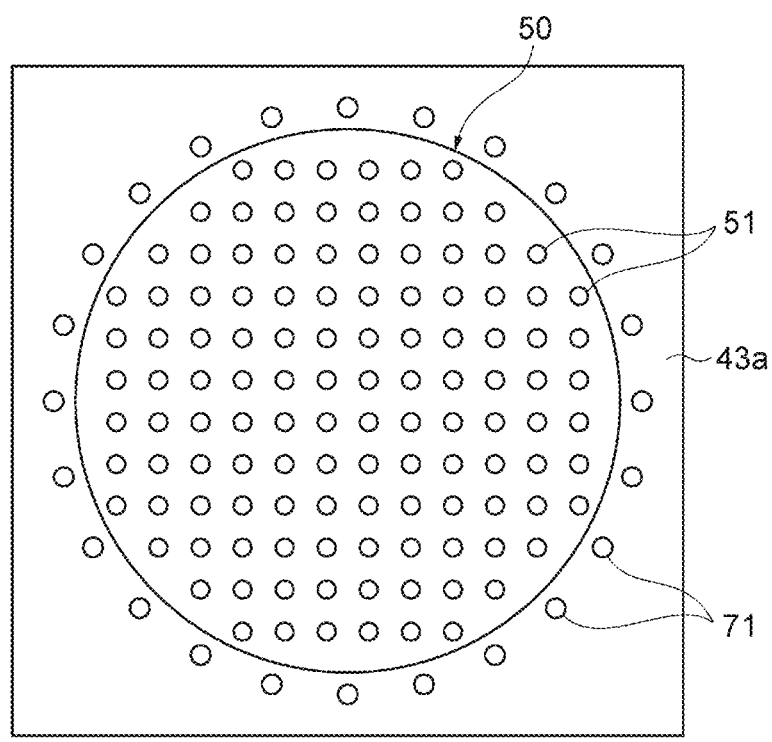
FIG. 5 is a schematic view illustrating the configuration of the vicinity of a gas ejecting unit of the heat treatment unit.
Figure 6:
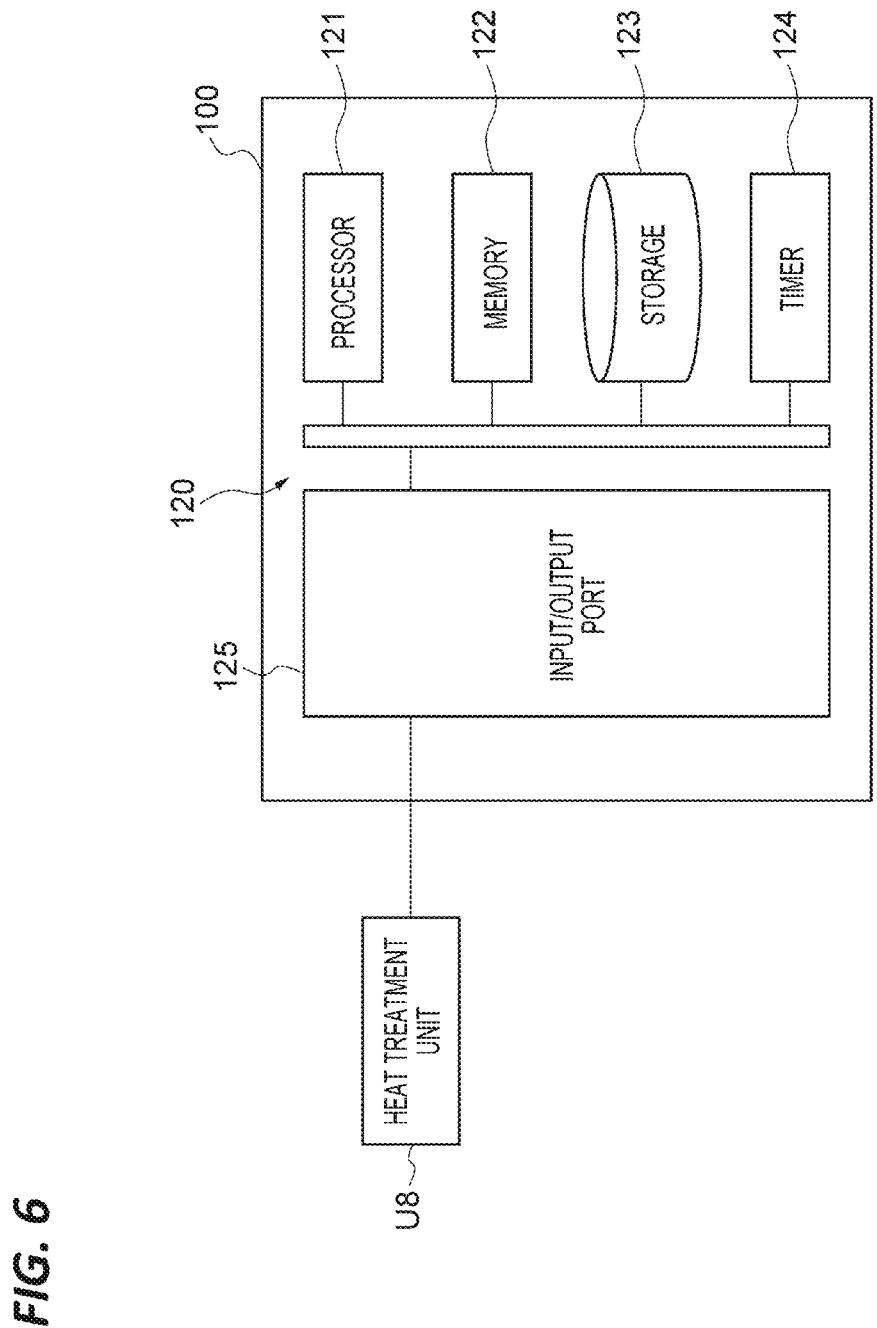
FIG. 6 is a block diagram illustrating a hardware configuration of a control device.

Subsequently, an example of the heat treatment unit U8 of the processing module 14 will be described in detail with reference to FIGS. 4 and 5. As illustrated in FIG. 4, the heat treatment unit U8 includes a heating mechanism 20, a wafer lifting mechanism 30 (lifting unit), an accommodating mechanism 40, a gas supply mechanism 60 (gas supply unit), and an exhaust mechanism 70 (exhaust unit). Meanwhile, in FIG. 4, hatching indicating a cross section is omitted except in some elements.

The heating mechanism 20 is configured to heat a wafer W. The heating mechanism 20 includes a heating plate 21. The heating plate 21 includes a heating plate heater 22. The heating plate 21 supports the wafer W as a heat treatment target, and heats the supported wafer W. The heating plate 21 is formed in substantially a disc shape as an example. The diameter of the heating plate 21 may be larger than the diameter of the wafer W. The heating plate 21 has a placing surface 21a. When the wafer W is placed on a predetermined position of the placing surface 21a, the heating plate 21 supports the wafer W. The heating plate 21 may be made of a metal having a high thermal conductivity, such as aluminum, silver, or copper.

The heating plate heater 22 raises the temperature of the heating plate 21. The heating plate heater 22 may be provided inside the heating plate 21, or may be provided on the heating plate 21. The heating plate heater 22 may be constituted by a resistance heating element. While a current flows through the heating plate heater 22, the heating plate heater 22 generates heat. Then, as the heat from the heating plate heater 22 is transferred, the temperature of the heating plate 21 is raised. A current having a value according to an instruction from the control device 100 may flow through the heating plate heater 22, or after a voltage of a value according to an instruction from the control device 100 is applied, a current according to the voltage value may flow.

The wafer lifting mechanism 30 is configured to raise and lower the wafer W above the heating plate 21. Specifically, the wafer lifting mechanism 30 raises and lowers the wafer W between a processing height at which the wafer W is placed on the placing surface 21a of the heating plate 21, and a delivery height at which the wafer W is delivered in the upper portion separated from the heating plate 21. The wafer lifting mechanism 30 includes a plurality of (for example, three) support pins 31, and a lift driving unit 32.

The support pins 31 are pins that support the wafer W from below. For example, the support pins 31 may be configured to extend through the heating plate 21 in the vertical direction. The plurality of support pins 31 may be arranged at equal intervals in the circumferential direction around the center of the heating plate 21. The lift driving unit 32 raises and lowers the support pins 31 according to an instruction of the control device 100. The lift driving unit 32 is, for example, a lifting actuator.

The accommodating mechanism 40 is configured to accommodate the wafer W as the heat treatment target. The accommodating mechanism 40 includes a chamber 41, and a chamber driving unit 45. The chamber 41 is configured to form a processing space S where a heat treatment is performed. That is, the chamber 41 covers the processing space S above the heating plate 21. The chamber 41 includes a lower chamber 42, an upper chamber 43, and a support ring 44 provided between the lower chamber 42 and the upper chamber 43.

The lower chamber 42 is provided around the heating plate 21. The lower chamber 42 may have a cylindrical shape so as to surround the peripheral portion of the heating plate 21. A space that communicates with the internal processing space S may be formed between the lower chamber 42 and the heating plate 21. This space functions as a gas flow path 81 that interconnects the inside and the outside of the processing space S. The gas flow path 81 may be annularly formed. When the lower chamber 42 is configured to hold the heating plate 21, it is possible to employ a configuration where a plurality of through holes is formed in the lower chamber 42 such that a plurality of gas flow paths 81 may be annularly formed between the lower chamber 42 and the heating plate 21 while lined up. The lower chamber 42 may be fixed to a predetermined position in the heat treatment unit U8.

When the gas flow path 81 is arranged as illustrated in FIG. 4, it is possible to employ a configuration where heat of the heating plate 21 may be transferred to the gas flow path 81. That is, heat generated by the heating plate heater 22 is transferred by heat conduction to the surface of the heating plate 21 forming a part of the gas flow path 81. The surface of the heating plate 21 forming the gas flow path 81 contacts the gas flowing through the gas flow path 81. When this configuration is employed, a gas within the gas flow path 81 may be heated by the heat from the heating plate 21. Further, since the configuration is provided not only in a part of the periphery of the substrate but also over the entire periphery thereof, the temperature of the substrate may be suppressed from being non-uniform The support ring 44 may be a plate-shaped and annular member attached to an upper end 42a of the lower chamber 42. In the support ring 44, an outer periphery edge 44a is fixed to the upper end 42a of the lower chamber 42, the inner periphery side protrudes toward the center side of the processing space S, and an inner periphery edge 44b is located at a position overlapping the heating plate 21 when viewed from the top. The inner periphery edge 44b of the support ring 44 is located at a position not overlapping the wafer W on the heating plate 21 when viewed from the top. A lower surface 44c of the support ring 44 and the placing surface 21a of the heating plate 21 are separated from each other, and this space becomes a part of the gas flow path 81 communicating with the processing space S. The gas flow path 81 and the support ring 44 described above function as a gas supply unit that supplies a gas into the chamber 41 from below the surface of the wafer W.

The upper chamber 43 is a lid that forms the processing space S within the chamber 41 together with the lower chamber 42. When the upper chamber 43 is abutted on the lower chamber 42, the processing space S is formed within the chamber 41. The upper chamber 43 may include a top plate 43a, and a side wall 43b.

The top plate 43a has a disc shape having a diameter that is about the same as the lower chamber 42 and the support ring 44. The top plate 43a is disposed to face the placing surface 21a of the heating plate 21 in the vertical direction. That is, the top plate 43a covers the placing surface 21a of the heating plate 21. The bottom surface of the top plate 43a constitutes the top surface of the processing space S. The side wall 43b is configured to extend downwards from the outer edge of the top plate 43a. The side wall 43b surrounds the placing surface 21a of the heating plate 21. The inner surface of the side wall 43b constitutes the peripheral surface of the processing space S.

The chamber driving unit 45 raises and lowers the upper chamber 43. For example, the chamber driving unit 45 is a lifting actuator. When the upper chamber 43 is raised by the chamber driving unit 45, the chamber 41 is placed in an open state. When the upper chamber 43 is lowered by the chamber driving unit 45 until being abutted on the support ring 44 on the lower chamber 42, the chamber 41 is placed in a close state. When the chamber 41 is in a close state, the processing space S is formed within the chamber 41. When the chamber 41 is in an open state, a space above the heating plate 21 is connected to a space outside the chamber 41. Meanwhile, even in a state where the processing space S is formed due to the close state of the chamber 41, a small space may be formed between the upper chamber 43 and the support ring 44. This space may become a gas flow path 82. Even in a state where the processing space S is formed due to the close state of the chamber 41, the processing space S is connected to the external space via the gas flow path 81 formed by the heating plate 21, the lower chamber 42, and the support ring 44. Meanwhile, as compared to that in the open state, the flow path communicated between the inside and outside of the processing space S is limited, and thus, the amount of a gas that may be moved is limited.

The upper chamber 43 includes a gas ejecting unit 50. The gas ejecting unit 50 ejects a gas from above toward the wafer W on the heating plate 21 within the chamber 41. The gas ejecting unit 50 ejects a moisture-containing gas toward the wafer W on the heating plate 21. The gas ejecting unit 50 may eject a gas other than the moisture-containing gas. For example, the gas ejecting unit 50 may eject an inert gas toward the wafer W on the heating plate 21. The gas ejecting unit 50 is provided in the top plate 43a. The gas ejecting unit 50 includes a buffer space formed on the lower side within the top plate 43a, and a plurality of gas ejecting holes 51 passing between the buffer space and the processing space S, on the bottom surface of the top plate 43a.

The ejecting holes 51 are scattered at a substantially uniform density within a portion (an opposing surface 50a) of the bottom surface of the top plate 43a facing the wafer W on the heating plate 21. For example, as illustrated in FIG. 5, the ejecting holes 51 are disposed in a scattered manner in a region of the opposing surface 50a facing the wafer W on the heating plate 21 (hereinafter, referred to as a "facing region"). The facing region is a region of the opposing surface 50a overlapping the wafer W on the heating plate 21 when viewed in the vertical direction. When the gas ejecting unit 50 ejects a moisture-containing gas, the ejecting holes 51 may be scattered (may be disposed in a scattered manner) such that the moisture amount (humidity) in the space on the upper surface of the wafer W may become substantially uniform over the whole region of the upper surface of the wafer W. The ejecting holes 51 may be scattered such that the hole density may become uniform in the facing region. The hole density is an occupation ratio of opening areas of the ejecting holes 51 per unit area within the facing region. Meanwhile, the region where the ejecting holes 51 are formed is formed while not including the outside of the facing region described above. That is, the ejecting holes 51 are formed only in a region overlapping the wafer W in a plan view, and are not formed outside thereof.

The opening areas of the ejecting holes 51 may be substantially the same. When viewed in the vertical direction, the shape of the ejecting holes 51 may be a circular shape. Intervals between the ejecting holes 51 may be uniform in the horizontal direction, and intervals between the ejecting holes 51 may be uniform in the longitudinal direction. Intervals between the ejecting holes 51 may be uniform in both the horizontal direction and the longitudinal direction.

Referring back to FIG. 4, the gas supply mechanism 60 is configured to supply a processing gas as a gas used for a heat treatment of the wafer W, to the gas ejecting unit 50. The gas supply mechanism 60 may supply a moisture-containing gas or an inert gas to the gas ejecting unit 50. For example, the gas supply mechanism 60 includes a gas supply path 61, and a gas supply source 62. Meanwhile, a plurality of gas supply sources may be provided according to, for example, the types of gases to be supplied. As necessary, for example, a gas switching unit may be provided.

The gas supply path 61 is a flow path for supplying a gas to the gas ejecting unit 50. One end of the gas supply path 61 is connected to the gas ejecting unit 50. The other end of the gas supply path 61 is connected to the gas supply source 62. For example, a valve for controlling a gas amount of a gas to be supplied to the gas ejecting unit 50 may be provided on the gas supply path 61. The valve may be configured to switch opening and closing on the basis of an instruction from the control device 100.

The gas supply source 62 supplies a gas to the gas ejecting unit 50 via the gas supply path 61. The gas supply source 62 may supply, for example, a moisture-containing gas whose moisture concentration has been adjusted toward the gas ejecting unit 50. The gas supply source 62 may supply an inert gas toward the gas ejecting unit 50. The inert gas is a gas that hardly reacts with a metallic sublimate generated from a film when the wafer W is heated. The gas supply source 62 may supply, as the inert gas, a gas having a lower oxygen concentration, or a gas having a lower humidity than the moisture-containing gas. For example, the gas supply source 62 may supply nitrogen ($N_2$) gas as the gas having a low oxygen concentration, or may supply dry air as the gas having a low humidity.

The exhaust mechanism 70 (exhaust unit) is configured to discharge a gas within the chamber 41 to the outside of the chamber 41. The exhaust mechanism 70 evacuates the inside of the chamber from the outer periphery of the processing space S via exhaust holes formed outside the gas ejecting unit 50. The exhaust mechanism 70 includes a plurality of exhaust holes 71, and an exhaust device 72. As exemplified in FIG. 5, the plurality of exhaust holes 71 is formed in the outer periphery portion of the opposing surface 50a of the gas ejecting unit 50 corresponding to the wafer W. The exhaust holes 71 are formed within the top plate 43a of the upper chamber 43, and each is open in the outer periphery portion in the inner surface of the top plate 43a (that is, in the outer periphery portion of the top surface of the processing space S). The shape of the exhaust holes 71 within the top plate 43a is not particularly limited. The exhaust device 72 discharges a gas within the processing space S to the outside of the chamber 41 via the plurality of exhaust holes 71. The exhaust device 72 is, for example, an exhaust pump. Meanwhile, the exhaust holes 71 may be annularly formed outside the gas ejecting unit 50. Meanwhile, the exhaust holes 71 may be configured such that at least a part of the exhaust holes 71 is formed outside the outer periphery of the wafer W when viewed from above. That is, the exhaust holes 71 may be formed at a position where a part of the exhaust holes 71 overlaps the wafer W when viewed from the top.

In the processing space S, an end portion 81a of the gas flow path 81 (an end portion on the processing space S side) is formed on the outer periphery side around the wafer W. The end portion 81a is formed outside the outer periphery of the wafer W (outside the wafer W in the radial direction). The position of the end portion 81a may be lower than the upper surface of the wafer W. The position of the end portion 81a of the gas flow path 81 may be controlled by the position or shape of the inner periphery edge 44b of the support ring 44. That is, the support ring 44 also functions as a rectifying unit that regulates a movement route of a gas moving through the gas flow path 81, and controls a flow path area.

Above the support ring 44 protruding toward the center within the processing space S, an outer space S1 is formed while being continuous from a gap with the top plate 43a of the upper chamber 43, which may become the gas flow path 82. The outer space S1 is formed on the outer periphery side of the exhaust holes 71 of the exhaust mechanism 70 in the radial direction of the heat treatment unit U8. The outer space S1 has a larger cross-sectional area than the gas flow path 82 when viewed in the vertical direction. Therefore, the flow velocity of a gas introduced to the outer space S1 from the gas flow path 82 is decreased in the outer space S1. The gas flow path 82 functions as a second gas supply unit that supplies a gas to the outer space S1 within the processing space S.

Meanwhile, the type of a gas to be supplied from the gas flow path 81 and the gas flow path 82 is not particularly limited, and may be, for example, atmosphere. It is possible to employ a configuration in which a gas supply source is connected to the gas flow path 81 and the gas flow path 82 so as to supply a processing gas.

(Control Device)

As illustrated in FIG. 1, the control device 100 includes a storage 101 and a controller 102 as a functional configuration. The storage 101 stores a program for operating units of the coating/developing apparatus 2 which include the heat treatment unit U8. The storage 101 also stores various data pieces (for example, information on an instruction signal for operating the heat treatment unit U8), or information from, for example, sensors provided in the units. The storage 101 is, for example, a semiconductor memory, an optical recording disc, a magnetic recording disk, or a magneto-optical recording disk. The program may be included in an external storage device separate from the storage 101, or an intangible medium such as a propagation signal. The program may be installed in the storage 101 from these other media, and may be stored in the storage 101. The controller 102 controls operations of the units of the coating/developing apparatus 2 on the basis of the program read from the storage 101.

The control device 100 is constituted by one or a plurality of control computers. For example, the control device 100 includes a circuit 120 illustrated in FIG. 6. The circuit 120 includes one or a plurality of processors 121, a memory 122, a storage 123, a timer 124, and an input/output port 125. The storage 123 includes a computer-readable storage medium such as, for example, a hard disk. The storage medium stores a program that causes the control device 100 to execute a substrate processing procedure to be described below. The storage medium may be a removable medium such as a non-volatile semiconductor memory, a magnetic disk or an optical disc. The memory 122 temporarily stores the program loaded from the storage medium of the storage 123 and calculation results by the processor 121. The processor 121 configures each function module described above by executing the program in cooperation with the memory 122. The timer 124 measures an elapsed time by counting, for example, reference pulses in a fixed period. The input/output port 125 inputs/outputs an electrical signal to/from the heat treatment unit U8 according to an instruction from the processor 121.

Meanwhile, a hardware configuration of the control device 100 is not necessarily limited to the configuration of each function module by the program. For example, each function module of the control device 100 may be configured by a dedicated logic circuit or an application specific integrated circuit (ASIC) in which this is integrated.

[On Operation in Heat Treatment Unit]

Referring back to FIG. 4, descriptions will be made on operations during a heat treatment in the heat treatment unit U8. At the time of the heat treatment, first, the controller 102 of the control device 100 raises the upper chamber 43 by driving the chamber driving unit 45. Accordingly, the space inside the chamber 41 is connected to the space outside the chamber 41. Next, the controller 102 of the control device 100 controls the transfer device A3 and the wafer lifting mechanism 30 so as to load the wafer W into the chamber 41. For example, in a state where the support pins 31 are raised by driving of the lift driving unit 32 by a wafer lifting controller 112, the control device 100 controls the transfer device A3 so as to dispose the wafer W on the support pins 31.

Next, the controller 102 of the control device 100 lowers the upper chamber 43 by driving the chamber driving unit 45. Under the control of the controller 102, the wafer lifting controller 112 lowers the support pins 31 by driving the lift driving unit 32 so that the wafer W supported by the support pins 31 is placed on the heating plate 21. In this manner, the processing space S is formed within the chamber 41, and the wafer W is placed on the placing surface 21a, and then, the heat treatment on the wafer W as a processing target is started.

While the heat treatment on the wafer W is performed, the controller 102 of the control device 100 controls the flow of a gas within the processing space S by operating the gas supply mechanism 60 and the exhaust mechanism 70. Specifically, by the control of the control device 100, a gas is supplied at a predetermined flow rate L1 from the gas supply mechanism 60 into the processing space S through the gas ejecting unit 50. Under the control of the control device 100, the gas within the processing space S is discharged at a predetermined flow rate L2 by the exhaust mechanism 70 from the exhaust holes 71 to the outside of the processing space S. Here, in the heat treatment unit U8, the amount of the gas supplied by the gas supply mechanism 60 and the amount of the gas discharged by the exhaust mechanism 70 are controlled such that L1<L2. Therefore, a gas corresponding to the difference (L2−L1) is supplied from the gas flow path 81 and the gas flow path 82 into the processing space S. Since the gas flow path 81 and the gas flow path 82 are connected to the outside of the processing space S, a gas in a predetermined amount (L2−L1) is supplied from the outside. Meanwhile, the gas flow path 82 is placed in a close state (is closed while the upper chamber 43 is abutted on the support ring 44), or in a state where the flow path cross-sectional area is very small as compared to that in the gas flow path 81. Thus, an amount of the gas supplied into the processing space S through the gas flow path 81 becomes sufficiently larger than an amount of the gas supplied into the processing space S through the gas flow path 82. The control is performed such that a flow rate L3 of the gas supplied from the gas flow path 81 becomes larger than the flow rate L1 of the gas supplied from the gas ejecting unit 50, that is, a relationship of L3>L1 may be satisfied.

As described above, within the processing space S, the gas is supplied substantially uniformly at the flow rate L1 from the gas ejecting unit 50 toward the surface of the wafer W. Meanwhile, since the flow rate L2 of the gas evacuated from the exhaust holes 71 is larger than the flow rate L1, the gas corresponding to the difference is supplied from the outside into the processing space S through the gas flow path 81 (and the gas flow path 82). Both the gas supplied to the surface of the wafer W from the gas ejecting unit 50 and the gas supplied from the outside through the gas flow path 81 (and the gas flow path 82) are discharged to the outside from the exhaust holes 71 by the exhaust mechanism 70. Thus, on the surface of the wafer W, the gas moves in the radial direction from the center of the wafer W toward the outer periphery. Around the wafer W, since the gas supplied from the gas flow path 81 into the processing space S moves to the exhaust holes 71, an upward flow is formed. The gas that has moved in the radial direction along the wafer W also moves upwards in a state where the gas is included in the above-described upward flow, and is discharged from the exhaust holes 71. Meanwhile, the "upward flow" refers to an upward flow of a gas.

Here, when a film formed on the surface of the wafer W that is being processed in the heat treatment unit U8 is a film of a metal-containing resist, a sublimate including a metal component is generated from the surface of the wafer W during the heat treatment. This sublimate tends to adhere to a peripheral member (for example, the chamber 41) having a lower temperature than the heating plate 21. This sublimate includes a metal component, and thus may cause contamination of a device when adhering to, for example, the wall surface, the bottom surface, and the top surface of the heat treatment unit U8. A possibility that a performance degradation of a device may occur due to adhesion of the sublimate is also taken into consideration. Meanwhile, this sublimate may move together with a gas near the surface of the wafer W. Therefore, in order to suppress the scattering of the sublimate within the processing space S, it is required to control the movement of a gas that may include the sublimate on the surface of the wafer W such that the gas is not dispersed within the processing space S.

Meanwhile, the distribution of a gas on the surface of the wafer W affects the quality of a resist pattern on the wafer W, particularly, the uniformity of a line width CD. The dimension of a resist pattern using a metal-containing resist is affected by the moisture amount within the chamber 41 during the heat treatment. When the distribution of the moisture amount on one wafer W is biased, the amount of moisture that reacts within the film (reacting moisture amount) is also biased. Therefore, it is required that on the surface of the wafer W, a gas supplied to the gas ejecting unit 50 be homogeneous, and a difference in a reacting moisture amount between the center region and the outer periphery region of the wafer W be small during the heat treatment. The uniformity of the line width of the resist pattern on the surface of the wafer W is also related to the quality of, for example, a semiconductor product obtained from the wafer W. Therefore, it is required to control the movement of a gas on the wafer W such that the uniformity of the line width of the resist pattern may be improved.

In relation to the above-described point, in the heat treatment unit U8, the exhaust holes 71 are formed at the outer periphery of the wafer W, and the gas flow path 81 is also formed at the outer periphery of the wafer W in addition to the gas ejecting unit 50 from which a gas is supplied toward the surface of the wafer W. Accordingly, an upward flow is formed from the vicinity of the outer periphery edge of the wafer W toward the exhaust holes 71. Here, a gas that is supplied from the gas ejecting unit 50 to the surface of the wafer W and moves along the surface of the wafer W, which may include a sublimate, also moves together with the upward flow to the exhaust holes 71. Therefore, it is possible to prevent the sublimate from adhering to, for example, a peripheral member on the periphery outside the upward flow. Meanwhile, when the exhaust holes 71 are configured to include a region located close to the wafer W and disposed outside the periphery edge of the wafer W when viewed from above, scattering of the sublimate may be further suppressed. Even when the exhaust holes 71 are formed at the outer periphery of the wafer W when viewed from above, if the exhaust holes 71 are located close to the side wall of the chamber (the side wall 43b of the upper chamber 43), the upward flow is formed in the vicinity of the side wall of the chamber. In this case, it is thought that the possibility of scattering of the sublimate may increase. That is, in a configuration where the exhaust holes 71 are formed at a position close to the wafer W when viewed from above, scattering of the sublimate may be further suppressed.

Meanwhile, when the upward flow in the outer periphery of the wafer W flows in a state where adjustment has been made to some extent, it is thought that a gas on the surface of the wafer W easily smoothly flows to the exhaust holes 71, in the vicinity of the outer periphery of the wafer W. For that purpose, it is considered that the flow velocity of a gas at the end portion 81a of the gas flow path 81 is increased to some extent, so that the flow velocity of the upward flow when the gas is introduced from the gas flow path 81 into the processing space S is increased to some extent. In the heat treatment unit U8, the support ring 44 functions as a rectifying unit in order to realize the above-described state.

Descriptions will be made on the shape of the end portion 81a of the gas flow path 81 due to arrangement of the support ring 44, and the state of movement of a gas and a sublimate within the processing space S, with reference to FIGS. 7A to 7C and FIGS. 8A and 8B.

Figure 7A:
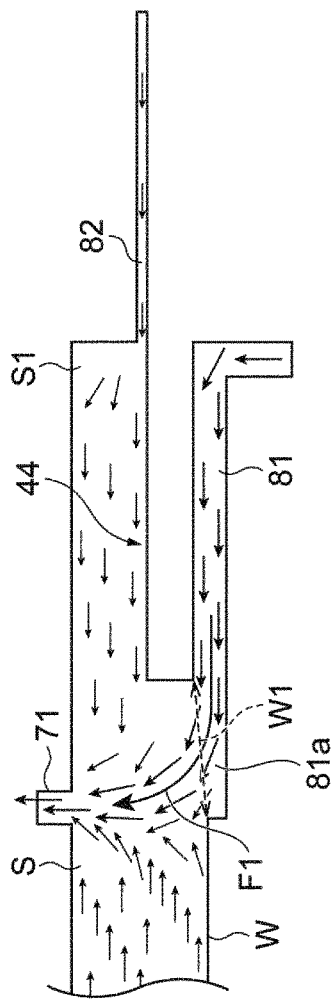
FIGS. 7A to 7C are views illustrating a simulation result according to movement of a gas and a sublimate in the heat treatment unit.
Figure 7B:
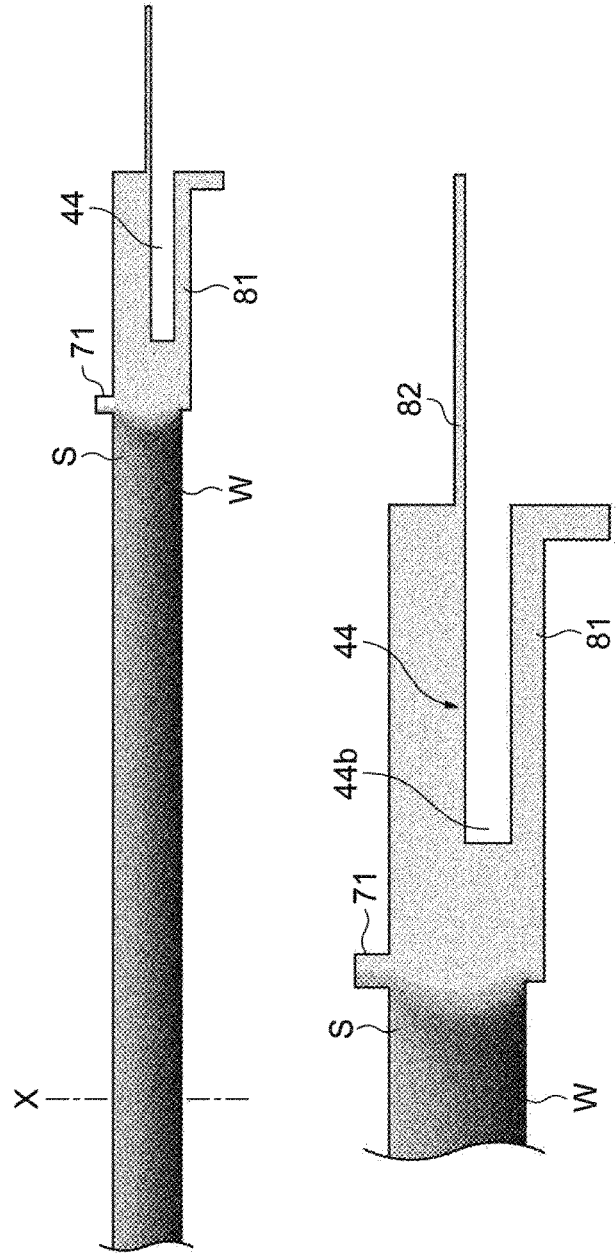
Figure 7C:
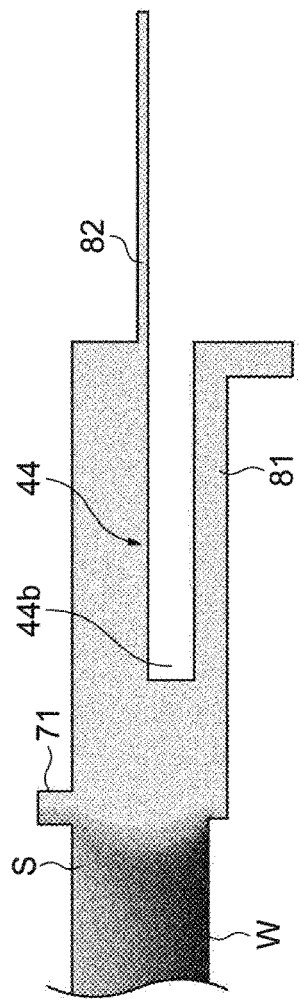

FIG. 7A illustrates a simulation result of gas movement outside the wafer W within the processing space S. FIG. 7B illustrates a simulation result of sublimate movement from the wafer W. FIG. 7C is an enlarged view of the outside of the wafer W in FIG. 7B. Meanwhile, in FIG. 7B, a center line X is illustrated at a position corresponding to the center of the wafer W.

As illustrated in FIG. 7A, outside the wafer W, a gas supplied from the gas flow path 81 changes its traveling direction from the vicinity of the end portion 81a of the gas flow path 81, and then an upward flow F1 that moves upwards is formed. The upward flow F1 is formed because the volume of exhaust from the exhaust holes 71 is large. Meanwhile, a gas that moves along the surface of the wafer W in the radial direction toward the outer periphery merges with the upward flow F1 and moves upwards. Meanwhile, when the gas flow path 82 is open (when gas supply from the gas flow path 82 may occur), as illustrated in FIG. 7A, a gas supplied from the gas flow path 82 moves through the outer space S1 and reaches the exhaust holes 71. Therefore, when the gas is introduced from the gas flow path 82, the gas flowing through the outer space S1 forms a flow to such an extent that the upward flow F1 is not interrupted and moves to the exhaust holes 71.

As illustrated in FIG. 7B, a sublimate from the surface of the wafer W is scattered above the wafer W. Meanwhile, in particular, as illustrated in FIG. 7C, the sublimate is suppressed from being scattered toward the outer periphery of the wafer W. In this manner, within the processing space S, since the upward flow F1 is formed, the gas moving above the wafer W is suppressed from moving to the outside of the upward flow F1. Thus, the sublimate may be suppressed from being scattered toward the outside.

Figure 8A:
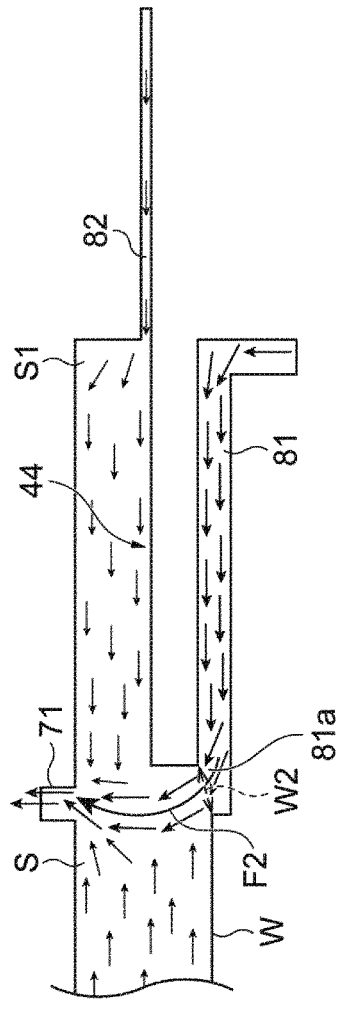
FIGS. 8A and 8B are views illustrating a simulation result according to movement of a gas and a sublimate in the heat treatment unit.
Figure 8B:
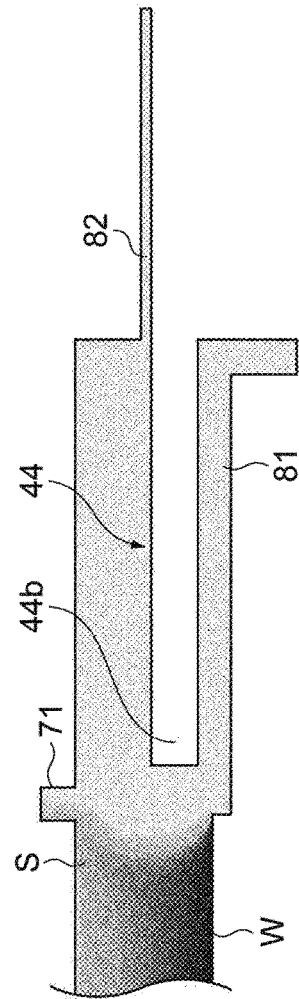

FIGS. 8A and 8B illustrate a simulation result in a state where the inner periphery edge 44b of the support ring 44 is made close to the wafer W side as compared to the state illustrated in FIGS. 7A to 7C. FIG. 8A illustrates a simulation result corresponding to FIG. 7A, and FIG. 8B illustrates a simulation result corresponding to FIG. 7C.

In FIG. 8A as well, as in FIG. 7A, it can be found that outside the wafer W, a gas supplied from the gas flow path 81 changes its traveling direction from the vicinity of the end portion 81a of the gas flow path 81, and then an upward flow F2 that moves upwards is formed. Meanwhile, unlike in the example illustrated in FIG. 7A, the upward flow F2 is curved near the outer periphery edge of the wafer W and thus has a sharp curvature. It is thought that this is because the end portion 81a of the gas flow path 81 is closer to the wafer W than the example illustrated in FIG. 7A, and thus, a gas course sharply changes due to a positional relationship with the exhaust holes 71. Since a distance between the end portion 81a and the wafer W is closer, as illustrated in FIG. 8B, a width W2 of the flow path formed by the side surface of the wafer W and the support ring 44 is smaller than a width W1 illustrated in FIG. 7C. As a result, it is thought that in the example illustrated in FIG. 8B, as compared to in the example illustrated in FIG. 7C, when moving through this region, a gas is suppressed from spreading, and thus the upward flow F2 with a narrower width is formed. These widths W1 and W2 correspond to the flow path areas at the corresponding position.

In this manner, as a result of formation of the upward flow F2 near the edge of the wafer W, in the example illustrated in FIGS. 8A and 8B, a sublimate is further suppressed from being scattered in the vicinity of the surface of the wafer W. This may be confirmed by comparing FIG. 8B to FIG. 7C. In the example illustrated in FIG. 8B, it is confirmed that a sublimate that moves downwards from the edge of the wafer W along the outer periphery wall of the wafer W is reduced as compared to that in FIG. 7C. As described above, when the upward flow F2 that is strong to some extent is formed near the edge of the wafer W, the sublimate may also be prevented from falling from the edge of the wafer W.

In this manner, the effect of suppressing scattering of a sublimate by an upward flow may be changed depending on how much gas is supplied from the gas flow path 81 to form the upward flow.

Meanwhile, as described above, the distribution of a gas on the surface of the wafer W affects the quality of a resist pattern on the wafer W. Therefore, it is required to control the movement of the gas on the wafer W such that the uniformity of a line width of the resist pattern may not be deteriorated due to unevenness of a gas flow on the surface of the wafer W. Accordingly, the gas ejecting unit 50 that has the ejecting holes 51 scattered along the surface facing the wafer W on the heating plate 21 may be used so that a variation depending on the supply of the gas toward the surface of the wafer W may be reduced. Meanwhile, if the flow rate of the gas toward the exhaust holes 71 becomes excessively large, the gas supplied to the wafer W moves too fast. This may affect the quality of the resist pattern. Therefore, it is possible to employ a mode in which the movement of the gas on the wafer W is controlled within a range where the uniformity of the line width of the resist pattern is maintained.

The ratio of the amount of a gas supplied from the gas ejecting unit 50 to the amount of a gas introduced from the gas flow path 81 and the gas flow path 82 (the sum of introduction amounts from the two flow paths) may range from, for example, 1:6 to 1:2. The ratio of the amount of the gas introduced from the gas flow path 82, to the amount of the gas introduced from the gas flow path 81 and the gas flow path 82 (the sum of introduction amounts from the two flow paths) may be, for example, 30% or less. By controlling the movement of the gas from each unit such that the above-described ranges are satisfied, it is possible to suppress scattering of a sublimate through formation of an upward flow, and to enhance the uniformity of a line width of a resist pattern on the wafer W.

[Action]

As described above, according to the above-described heat treatment device (the heat treatment unit U8) and the heat treatment method, a processing gas is ejected from the gas ejecting unit 50 toward the surface of the wafer W, so that the heat treatment of the wafer W is facilitated. Meanwhile, in the heat treatment unit U8, by the gas flow path 81, and the exhaust mechanism 70 that evacuates the inside of the chamber from the exhaust holes 71, a gas flowing between these forms an upward flow around the substrate. Thus, the movement of a sublimate generated from the wafer W during the heat treatment is blocked by the upward flow. Therefore, it is possible to suppress scattering of the sublimate from the film on the substrate.

As described above, when a metal-containing resist is used, since a sublimate from a film contains a metal component, influence by adhesion to each unit within the device may be large. In such a case, by employing the above-described configuration, it is possible to suppress the scattering of the sublimate that contains the metal component from the film on the substrate. Therefore, it is possible to effectively reduce the influence by adhesion of the sublimate to the device.

As described above, a gas is supplied from the periphery outside the wafer W into the chamber, and thus it is possible to form an upward flow in which the air flow is further strengthened, around the wafer W.

When the gas supply unit includes the gas flow path 81 connected to the inside of the chamber, and the support ring 44 as a rectifying unit that controls a flow path area at the end portion 81a of the gas flow path 81 on the chamber 41 side, the flow path area may be controlled by these. Therefore, for example, it is also possible to control an upward flow such that it is possible to further suppress the scattering of a sublimate. It is also possible to control the upward flow in consideration of the quality of a resist pattern on the wafer W.

As described above, it is possible to employ a configuration in which the outer space S1 is formed outside the exhaust holes 71 of the exhaust mechanism 70 as the exhaust unit, in the radial direction of the wafer W, and a gas is also supplied from the gas flow path 82 as the second gas supply unit connected to the outer space S1. In this case, the gas that is supplied from the gas flow path 82 and moves in the outer space S1 also moves toward the exhaust holes 71, and thus, the disturbance of an upward flow may be prevented, and the scattering of a sublimate may be suppressed. Here, when the gas flow path 82 is connected to the outer space S1 on the support ring 44 side, that is, from below, for example, the gas may be prevented from staying in the outer space and the vicinity thereof.

As described above, when the gas flow path 81 is capable of transferring heat from the heating plate 21, a gas that moves through the gas flow path 81 may be supplied into the chamber in a state where the gas is heated by the heat from the heating plate. Therefore, it is possible to suppress, for example, temperature fluctuation within the chamber 41 due to supplying of the gas from the gas flow path 81.

As in the gas ejecting unit 50, when the ejecting holes 51 scattered along the surface facing the wafer W on the heating plate 21 are included, since a processing gas may be more uniformly ejected toward the surface of the wafer W, the quality of a resist pattern may be enhanced.

Second Embodiment

Figure 9:
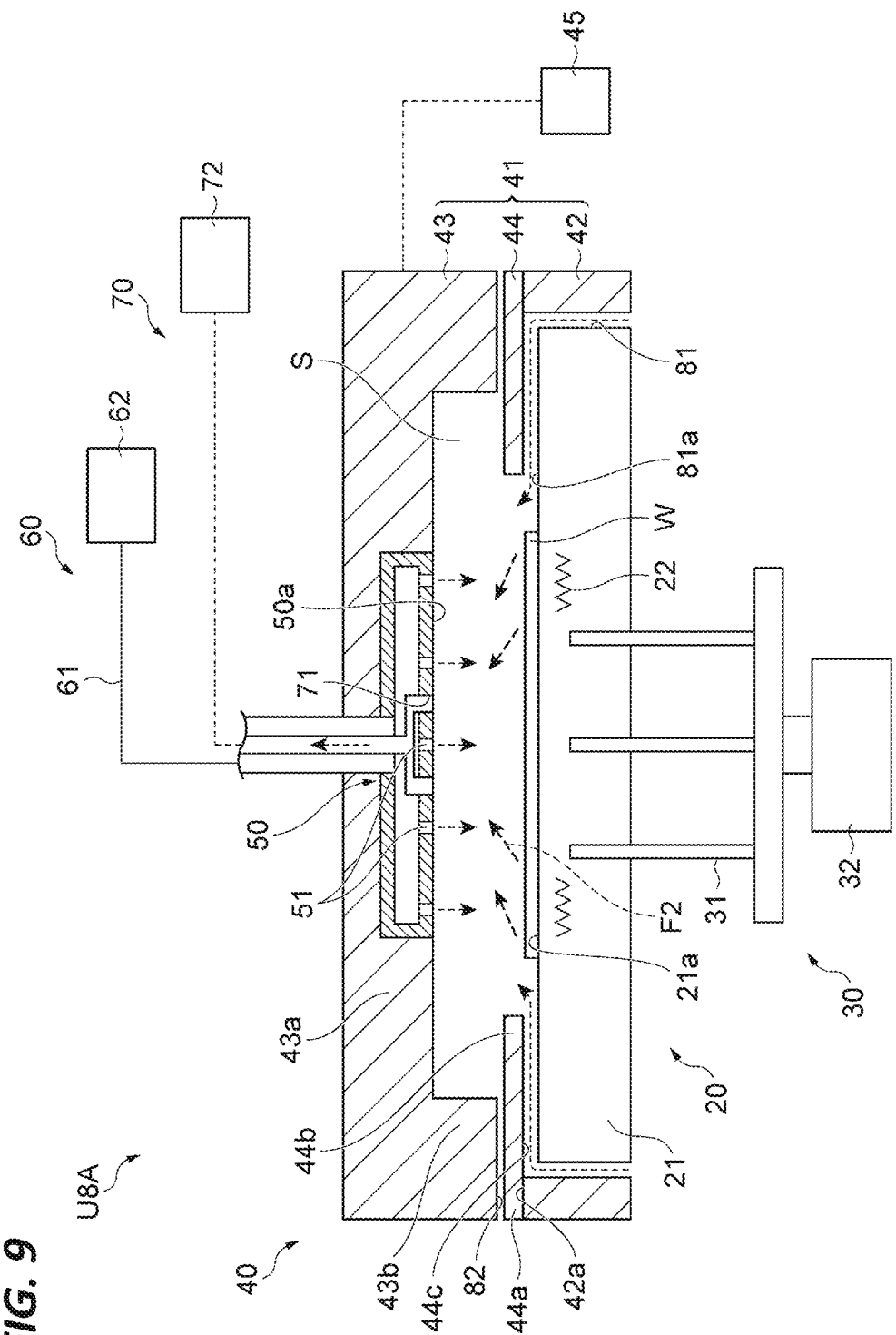
FIG. 9 is a schematic view illustrating the configuration of a heat treatment unit according to a second embodiment.

Next, a heat treatment device according to a second embodiment (a heat treatment unit U8A) will be described. FIG. 9 is a view illustrating an example of the heat treatment unit U8A according to the second embodiment. As illustrated in FIG. 9, the heat treatment unit U8A includes the heating mechanism 20, the wafer lifting mechanism 30 (lifting unit), the accommodating mechanism 40, the gas supply mechanism 60 (gas supply unit), and the exhaust mechanism 70 (exhaust unit). This is the same as the heat treatment unit U8 according to the first embodiment. The configuration of the gas flow paths 81 and 82 is also the same as that in the heat treatment unit U8. The heat treatment unit U8A is different from the heat treatment unit U8 in the arrangement of the exhaust mechanism 70.

In the heat treatment unit U8A, the exhaust hole 71 of the exhaust mechanism 70 (exhaust unit) is formed inside the periphery edge of the opposing surface 50a of the gas ejecting unit 50 facing the wafer W. In the example illustrated in FIG. 9, the exhaust hole 71 is formed near the center of the opposing surface 50a. In FIG. 9, a plurality (two) of exhaust holes 71 is illustrated, but a configuration in which one exhaust hole 71 is formed at the center may be employed. When the plurality of exhaust holes 71 is formed, the ejecting holes 51 may be formed on the center side of the exhaust holes 71. At that time, the ejecting holes 51 may be formed with the same size or distribution density as those in the portion outside the exhaust holes 71. In the example illustrated in FIG. 9, the exhaust holes 71 and the gas supply path 61 of the gas supply mechanism 60 have a double structure, but the structure of this portion is not particularly limited.

In the heat treatment unit U8A as well, the control of a gas flow by the controller 102 of the control device 100 is the same as that in the heat treatment unit U8. That is, while the heat treatment on the wafer W is performed, the controller 102 operates the gas supply mechanism 60 and the exhaust mechanism 70, so that a gas is supplied at a predetermined flow rate L1 from the gas supply mechanism 60 into the processing space S through the gas ejecting unit 50. Under the control of the control device 100, the gas within the processing space S is discharged at a predetermined flow rate L2 by the exhaust mechanism 70 from the exhaust holes 71 to the outside of the processing space S. Here, the amount of the gas supplied by the gas supply mechanism 60 and the amount of the gas discharged by the exhaust mechanism 70 are controlled such that the relationship between flow rates satisfies L1<L2. Therefore, a gas corresponding to the difference (L2−L1) is supplied from the gas flow path 81 and the gas flow path 82 into the processing space S. The gas flow path 82 is placed in a close state (is closed while the upper chamber 43 is abutted on the support ring 44), or in a state where the flow path cross-sectional area is very small as compared to that in the gas flow path 81. Thus, an amount of the gas supplied into the processing space S through the gas flow path 81 becomes sufficiently larger than an amount of the gas supplied into the processing space S through the gas flow path 82. The control is performed such that a flow rate L3 of the gas supplied from the gas flow path 81 becomes larger than the flow rate L1 of the gas supplied from the gas ejecting unit 50, that is, a relationship of L3>L1 may be satisfied.

When the gas flow rate is controlled as described above, the gas supplied from the gas flow path 81 changes its traveling direction from the vicinity of the end portion 81a of the gas flow path 81, and then an upward flow F3 that moves upwards while moving in a direction toward the center of the wafer W (toward the formed exhaust holes 71) is formed. The upward flow F3 is formed because the volume of exhaust from the exhaust holes 71 is large. Meanwhile, unlike the upward flows F1 and F2 described in the first embodiment, the upward flow F3 becomes a gas flow toward the inner periphery side of the wafer W.

When the exhaust holes 71 are formed inside the periphery edge of the opposing surface 50a of the gas ejecting unit 50 facing the wafer W, the gas introduced from the end portion 81a of the gas flow path 81 moves toward the exhaust holes 71 formed inside the outer periphery of the wafer W. Therefore, a sublimate generated from the wafer W during the heat treatment moves toward the exhaust holes 71 together with the upward flow F3.

As described above, in the heat treatment device (the heat treatment unit U8A) as well, a processing gas is ejected from the gas ejecting unit 50 toward the surface of the wafer W so that the heat treatment of the wafer W is facilitated. Meanwhile, in the heat treatment unit U8, by the gas flow path 81, and the exhaust mechanism 70 that evacuates the inside of the chamber from the exhaust holes 71, a gas flowing between these forms an upward flow around the substrate. Thus, the movement of a sublimate generated from the wafer W during the heat treatment is blocked by the upward flow. Therefore, it is possible to suppress scattering of the sublimate from the film on the substrate.

As illustrated in FIG. 9, when the exhaust holes 71 are formed inside the periphery edge of (the opposing surface 50a of) the gas ejecting unit 50, the upward flow F3 is formed toward the inside of the wafer W. In this case, in particular, it is possible to prevent the sublimate from adhering to the outside of the periphery edge of the wafer W, in the lower portion within the processing space S (for example, the surface of the heating plate 21, and the inner periphery edge 44b of the support ring 44). It is thought that this is because through a configuration where the upward flow F3 is toward the inside of the wafer W, the flow of the gas that moves to the outside of the periphery edge of the wafer W may be further suppressed as compared to that in the configuration example described in the first embodiment. Therefore, it can be said that, in particular, in order to prevent the sublimate from adhering to the lower portion within the processing space S, it is advantageous to employ a configuration where the exhaust holes 71 are disposed inside the periphery edge of (the opposing surface 50a of) the gas ejecting unit 50.

Meanwhile, the arrangement of the exhaust holes 71 inside the periphery edge of (the opposing surface 50a of)

the gas ejecting unit 50 is not particularly limited. However, in order to substantially uniformly suppress the flow of the gas toward the outside of the periphery edge of the wafer W over the entire circumference of the wafer W, arrangement of the exhaust holes 71 near the center of (the opposing surface 50a of) the gas ejecting unit 50 is considered. The exhaust holes 71 may be arranged such that no significant variation occurs in distances between the gas flow paths 81 and 82 formed at the outer periphery of the wafer W and the exhaust holes 71, and thus it is possible to suppress the sublimate from scattering to the surroundings in the entire circumference of the wafer W.

[Others]

Although various embodiments have been described as described above, the present disclosure is not limited to the above-described embodiments, and various omissions, substitutions, and changes may be made. Elements in different embodiments may be combined to form other embodiments.

For example, the configuration of the gas flow paths 81 and 82 which supply a gas to the heat treatment unit U8 is not limited to the above-described embodiments. For example, the gas flow path 81 may be properly changed in a range where the outlet on the chamber 41 side is disposed below the surface of the wafer W. In the above, the gas flow path 81 has a region extending in the horizontal direction along the surface of the heating plate 21, but, for example, the gas flow path 81 may be formed through the heating plate 21.

In the above, although a case where the outer space S1 is formed has been described, the outer space S1 may not be formed. In this case, it is possible to employ a configuration where the shape of the upper chamber 43 is changed to a shape in which the outer space S1 is not present, and the upper chamber 43 also has a function of the support ring 44 as a rectifying unit.

According to the present disclosure, there is provided a technology of suppressing scattering of a sublimate from the film on the substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A heat treatment device comprising:
a heating plate configured to support and heat a substrate on which a resist film is formed, the resist film being subjected to an exposure processing;
a chamber configured to cover a processing space above the heating plate;
a gas ejector configured to eject a processing gas from above toward the substrate on the heating plate within the chamber;
a gas supply configured to supply a gas into the chamber along a gas flow path connected to an inside of the chamber, the gas flow path beginning from an outer periphery of the heating plate and extending along an upper surface of the heating plate to an end portion on an outer periphery of the substrate; and
an exhaust port configured to evacuate inside of the chamber through exhaust holes that are formed above the processing space and open downwards.

2. The heat treatment device according to claim 1, wherein the resist film is a metal-containing resist film.

3. The heat treatment device according to claim 1, wherein the exhaust holes are formed inside a peripheral edge of the gas ejector.

4. The heat treatment device according to claim 1, wherein at least a part of the exhaust holes is formed at an outer periphery of the substrate.

5. The heat treatment device according to claim 1, wherein the gas supply supplies the gas into the chamber from a periphery outside the substrate.

6. The heat treatment device according to claim 1, wherein the gas supply includes:
a rectifier that controls a flow path area at the end portion of the gas flow path on a chamber side.

7. The heat treatment device according to claim 6, wherein the chamber has an outer space above the rectifier outside the exhaust port in a radial direction of the substrate,
a second gas supply different from the gas supply is connected to the outer space and supplies a gas into the chamber, and
the second gas supply is connected to the outer space on a side of the rectifier.

8. The heat treatment device according to claim 1, wherein
the gas flow path is configured to transfer heat from the heating plate.

9. The heat treatment device according to claim 8, wherein the gas flow path is configured to transfer the heat from the heating plate by heat conduction of a solid member, and has a flow path forming surface that contacts the gas flowing through the gas flow path along a flow direction.

10. The heat treatment device according to claim 1, wherein the gas ejector includes a plurality of ejecting holes scattered along a surface facing the substrate on the heating plate.

11. The heat treatment device according to claim 1, further comprising:
a top plate forming a portion of the chamber, the top plate including a bottom surface forming an upper surface of the chamber,
wherein the gas ejector is formed in the top plate and is flush with the bottom surface of the top plate, the gas ejector including a plurality of gas ejecting holes, and
the exhaust port is formed in the top plate and is flush with the bottom surface of the top plate, and the exhaust holes are annularly formed outside the plurality of gas ejecting holes of the gas ejector, the exhaust holes directly facing a top surface of the heating plate.

12. A heat treatment method comprising:
providing a substrate formed with a resist film and subjected to an exposure process on a heating plate disposed in a chamber;
heating the substrate with the heating plate;
supplying a gas into the chamber along a gas flow path beginning from an outer periphery of the heating plate and extending along an upper surface of the heating plate to an end portion on an outer periphery of the substrate within the chamber; and
evacuating an inside of the chamber through exhaust holes that are formed above a processing space within the chamber and open downwards, thereby performing a heat treatment for the substrate while an upward flow is formed around the substrate.

* * * * *